US 8,861,553 B2

(12) United States Patent
Chen et al.

(10) Patent No.: US 8,861,553 B2
(45) Date of Patent: Oct. 14, 2014

(54) ASYNCHRONOUS MASTER-SLAVE SERIAL COMMUNICATION SYSTEM, DATA TRANSMISSION METHOD, AND CONTROL MODULE USING THE SAME THEREOF

(75) Inventors: Wen-Chuan Chen, Jincheng Township, Kinmen County (TW); Ying-Min Chen, Baoshan Township, Hsinchu County (TW); Chia-Ching Lin, Tainan (TW); Cheng-Xue Wu, Kaohsiung (TW); Jing-Yi Huang, Taoyuan (TW)

(73) Assignee: Industrial Technology Research Institute, Hsinchu (TW)

( * ) Notice: Subject to any disclaimer, the term of this patent is extended or adjusted under 35 U.S.C. 154(b) by 234 days.

(21) Appl. No.: 13/209,194

(22) Filed: Aug. 12, 2011

(65) Prior Publication Data

US 2012/0275454 A1    Nov. 1, 2012

(30) Foreign Application Priority Data

Apr. 29, 2011  (TW) .............................. 100115268 A (51) Int. Cl.
  *H04J 3/06* (2006.01)
  *H04L 1/00* (2006.01)
  *H03M 5/12* (2006.01)
  *H03M 13/09* (2006.01)

(52) U.S. Cl.
  CPC ............... *H04L 1/0061* (2013.01); *H03M 5/12* (2013.01); *H03M 13/09* (2013.01)
  USPC ............................. 370/509; 370/474; 714/807

(58) Field of Classification Search
  USPC ........................... 370/474, 503, 509; 714/807
  See application file for complete search history.

(56) References Cited

U.S. PATENT DOCUMENTS

| 4,422,171 | A | * | 12/1983 | Wortley et al. | ............... 714/748 |
| 4,513,370 | A | * | 4/1985 | Ziv et al. | ........................ 709/225 |
| 4,654,654 | A | * | 3/1987 | Butler et al. | ................... 370/463 |
| 5,867,501 | A | * | 2/1999 | Horst et al. | .................... 370/474 |
| 6,212,196 | B1 | * | 4/2001 | Momona | ....................... 370/449 |

(Continued)

FOREIGN PATENT DOCUMENTS

| CN | 1129858 | 12/2003 |
| CN | 1662008 A | 8/2005 |

(Continued)

OTHER PUBLICATIONS

English language translation of abstract of TW 415607 (published Dec. 11, 2000).

(Continued)

*Primary Examiner* — Phuc Tran
(74) *Attorney, Agent, or Firm* — McClure, Qualey & Rodack, LLP (57) ABSTRACT

An asynchronous master-slave serial communication system, a data transmission method, and a control module using the same are disclosed. The asynchronous master-slave serial communication system comprises a master control module and a slave control module. The master control module generates a check code according to an address information and a data information, and generates a data package according to the address information, the data information, the check code and the master clock signal. The slave control module generates a decoding data according to the data package and a slave clock signal, and generates the address information, the data information and the check code according to the decoding data.

29 Claims, 8 Drawing Sheets

(56) References Cited

U.S. PATENT DOCUMENTS

| | | | |
|---|---|---|---|
| 6,460,092 B1 | 10/2002 | Lai et al. | |
| 6,804,535 B2 * | 10/2004 | Takahashi | 455/557 |
| 6,944,248 B2 | 9/2005 | Sullivan | |
| 6,985,492 B1 * | 1/2006 | Thi et al. | 370/429 |
| 7,321,592 B2 * | 1/2008 | Scheel et al. | 370/402 |
| 7,522,689 B2 * | 4/2009 | Haartsen | 375/368 |
| 7,660,330 B1 * | 2/2010 | Shmilovici | 370/503 |
| 7,765,380 B2 * | 7/2010 | Norman | 711/201 |
| 2010/0188972 A1 * | 7/2010 | Knapp | 370/226 |
| 2011/0016374 A1 * | 1/2011 | Grivna et al. | 714/807 |
| 2011/0111708 A1 * | 5/2011 | Tu et al. | 455/82 |
| 2011/0249191 A1 * | 10/2011 | Bruckmeyer et al. | 348/724 |

FOREIGN PATENT DOCUMENTS

| | | |
|---|---|---|
| TW | 415607 | 12/2000 |
| TW | 453117 | 9/2001 |
| TW | 455805 | 9/2001 |
| TW | I223526 | 11/2004 |
| TW | 200522621 | 7/2005 |
| TW | I271626 | 1/2007 |
| TW | 200719150 | 5/2007 |
| TW | I298119 | 6/2008 |
| TW | 201019791 | 5/2010 |

OTHER PUBLICATIONS

English language translation of abstract of TW 453117 (published Sep. 1, 2001).
English language translation of abstract of TW 455805 (published Sep. 21, 2001).
English language translation of abstract of CN 1129858 (published Dec. 3, 2003).
English language translation of abstract of TW I223526 (published Nov. 1, 2004).
English language translation of abstract of TW 200522621 (published Jul. 1, 2005).
English language translation of abstract of TW I271626 (published Jan. 21, 2007).
English language translation of abstract of TW 200719150 (published May 16, 2007).
English language translation of abstract of TW I298119 (published Jun. 21, 2008).
English language translation of abstract of TW 201019791 (published May 16, 2010).
"Design of Synchronous and Asynchronous Controller;" Jun. 1997; pp. 1-21.
CN Office Action dated Jun. 17, 2014.
Full English (machine) translation of CN1662008 (Published Aug. 31, 2005).

* cited by examiner

ASYNCHRONOUS MASTER-SLAVE SERIAL COMMUNICATION SYSTEM, DATA TRANSMISSION METHOD, AND CONTROL MODULE USING THE SAME THEREOF

This application claims the benefit of Taiwan application Serial No. 100115268, filed Apr. 29, 2011, the subject matter of which is incorporated herein by reference.

BACKGROUND

1. Technical Field

The disclosure relates in general to an asynchronous master-slave serial communication system a data transmission method, and a control module using the same.

2. Description of the Related Art

Figure 1:
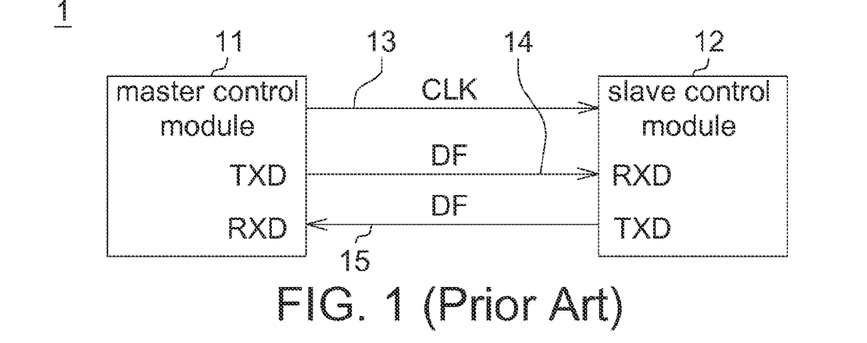
FIG. 1 shows a schematic diagram of a conventional synchronous master-slave serial communication system communication system.
Figure 2:
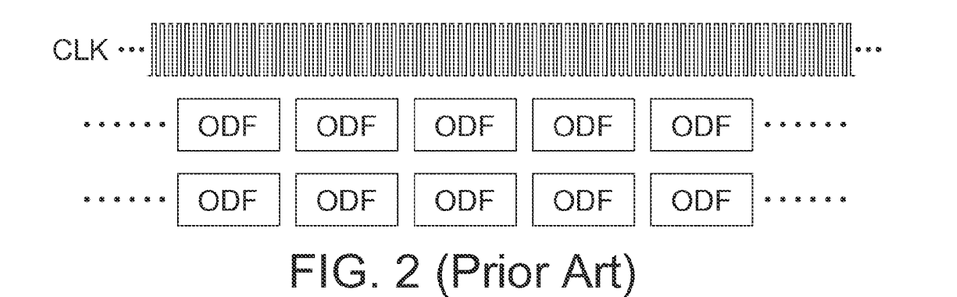
FIG. 2 shows a schematic diagram of a clock signal and a data package of a conventional synchronous master-slave serial communication system communication system.

Referring to FIG. 1 and FIG. 2. FIG. 1 shows a schematic diagram of a conventional synchronous master-slave serial communication system communication system. FIG. 2 shows a schematic diagram of a clock signal and a data package of a conventional synchronous master-slave serial communication system communication system. The conventional synchronous master-slave serial communication system communication system 1 comprises a master control module 11 and a slave control module 12. The master control module 11 transmits a data package ODF to the slave control module 12 through the data transmission line 14, and receives the data package ODF transmitted from the slave control module 12 through the data transmission line 15. The master control module 11 outputs a clock signal CLK to the slave control module 12 through the clock signal line 13. The slave control module 12 encodes the data package ODF according to the clock signal CLK provided by the master control module 11.

However, the clock signal may change or decay if the master control module 11 and the slave control module 12 are interfered with by factors in the working environment or affected by long range transmission, error might occur to the received or transmitted data, hence resulting in system instability.

SUMMARY

The disclosure is directed to an asynchronous master-slave serial communication system a data transmission method, and a control module using the same.

According to the disclosure, an asynchronous master-slave serial communication system is disclosed. The asynchronous master-slave serial communication system comprises a master control module and a slave control module. The master control module generates a check code according to an address information and a data information, generates a data package according to the address information, the data information, the check code and the master clock signal, and transmits the data package. The slave control module receives the data package, generates a decoding data according to the data package and a slave clock signal, and generates the address information, the data information and the check code according to the decoding data.

According to the disclosure, a data transmission method used in the asynchronous master-slave serial communication system is disclosed. The data transmission method comprises: generating a check code according to an address information and a data information, generating a data package according to the address information, the data information, the check code and the master clock signal, and transmitting the data package; receiving the data package, generating a decoding data according to the data package and a slave clock signal, and generating the address information, the data information and the check code according to the decoding data.

According to the disclosure, a control module used in the asynchronous master-slave serial communication system is disclosed. The control module comprises a data combining circuit, a data error check device, a multiplexer and an encoder. The data combining circuit combines an address information and a data information into a first serial data. The data error check device generates a check code according to the first serial data. The multiplexer outputs a second serial data according to the first serial data and the check code. The encoder encodes the second serial data according to the master clock signal and outputs a data package accordingly.

The above and other aspects of the disclosure will become better understood with regard to the following detailed description of the non-limiting embodiment(s). The following description is made with reference to the accompanying drawings.

DETAILED DESCRIPTION

An asynchronous master-slave serial communication system, a data transmission method, and a control module using the same are exemplified in the embodiments below. The asynchronous master-slave serial communication system comprises a master control module and a slave control module. The master control module generates a check code according to an address information and a data information, and generates a data package according to the address information, the data information, the check code and a master clock signal, and transmits the data package. The slave control module receives the data package, and generates a decoding data according to the data package and the slave clock signal, and generates the address information, the data information and the check code according to the decoding data.

The data transmission method comprises: generating a check code according to an address information and a data information, generating a data package according to the address information, the data information, the check code and a master clock signal, and transmitting the data package; receiving the data package, and generating a decoding data according to the data package and the slave clock signal, and generating the address information, the data information and the check code according to the decoding data.

The control module comprises a data combining circuit, a data error check device, a multiplexer and an encoder. The data combining circuit combines an address information and a data information into a first serial data. The data error check device generates a check code according to the first serial data. The multiplexer generates a second serial data according to the first serial data and the check code. The encoder encodes the second serial data according to the master clock signal and outputs a data package.

Figure 3:
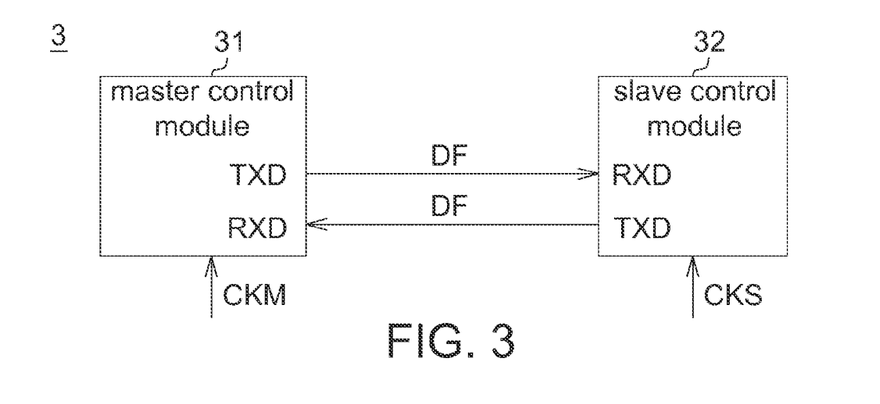
FIG. 3 shows a schematic diagram of an asynchronous master-slave serial communication system according to a first embodiment of the disclosure.
Figure 4:
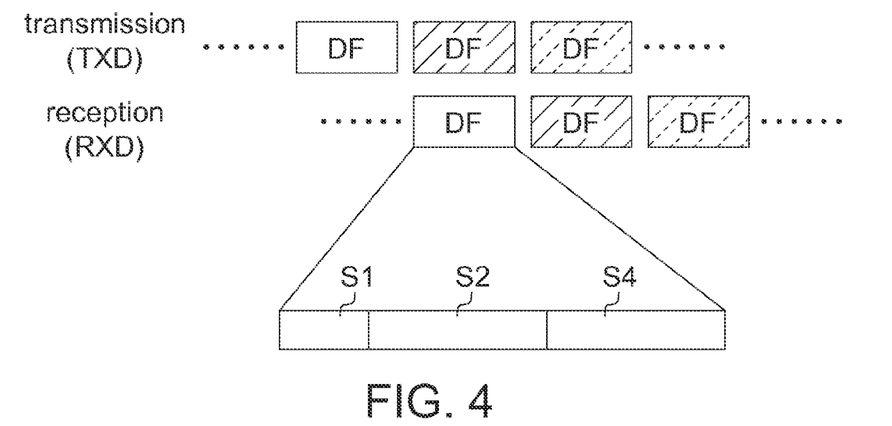
FIG. 4 shows a schematic diagram of data transmission.
Figure 5:
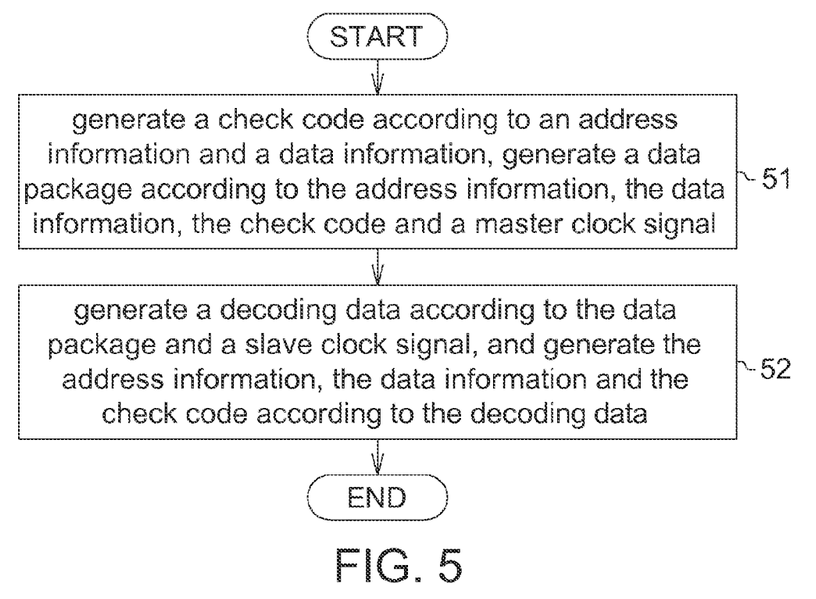
FIG. 5 shows a flowchart of a data transmission method used in the asynchronous master-slave serial communication system.

Referring to FIG. 3, FIG. 4 and FIG. 5. FIG. 3 shows a schematic diagram of an asynchronous master-slave serial communication system according to a first embodiment of the disclosure. FIG. 4 shows a schematic diagram of data transmission. FIG. 5 shows a flowchart of a data transmission method used in the asynchronous master-slave serial communication system. The asynchronous master-slave serial communication system 3 comprises a master control module 31 and the slave control module 32. As indicated in step 51, the master control module 31 generates a check code according to an X-bit address information and a Y-bit data information, and generates a data package DF according to the X-bit address information, the Y-bit data information, the check code and a master clock signal CKM of the master control module 31. The X-bit address information is used for addressing the slave control module 32. For example, if X is equal to 5, then the master control module 31 can address 32 slave control modules 32 with the 5-bit address information.

As indicated in step 52, the slave control module 32 generates a decoding data according to the data package DF and a slave clock signal CKS, and generates the X-bit address information, the Y-bit data information and the Z-bit check code according to the decoding data. Since the slave control module 32 decodes the data package DF according to the slave clock signal CKS of the slave control module 32, not any clock transmission line is required between the master control module 31 and the slave control module 32. Also, since the slave control module 32 decodes the data package DF according to the slave clock signal CKS of the slave control module 32, the clock signal will be free of deformation and decay caused by interference or long range transmission, so that decoding error can be avoided and the accuracy of data transmission can be assured.

Figure 6:
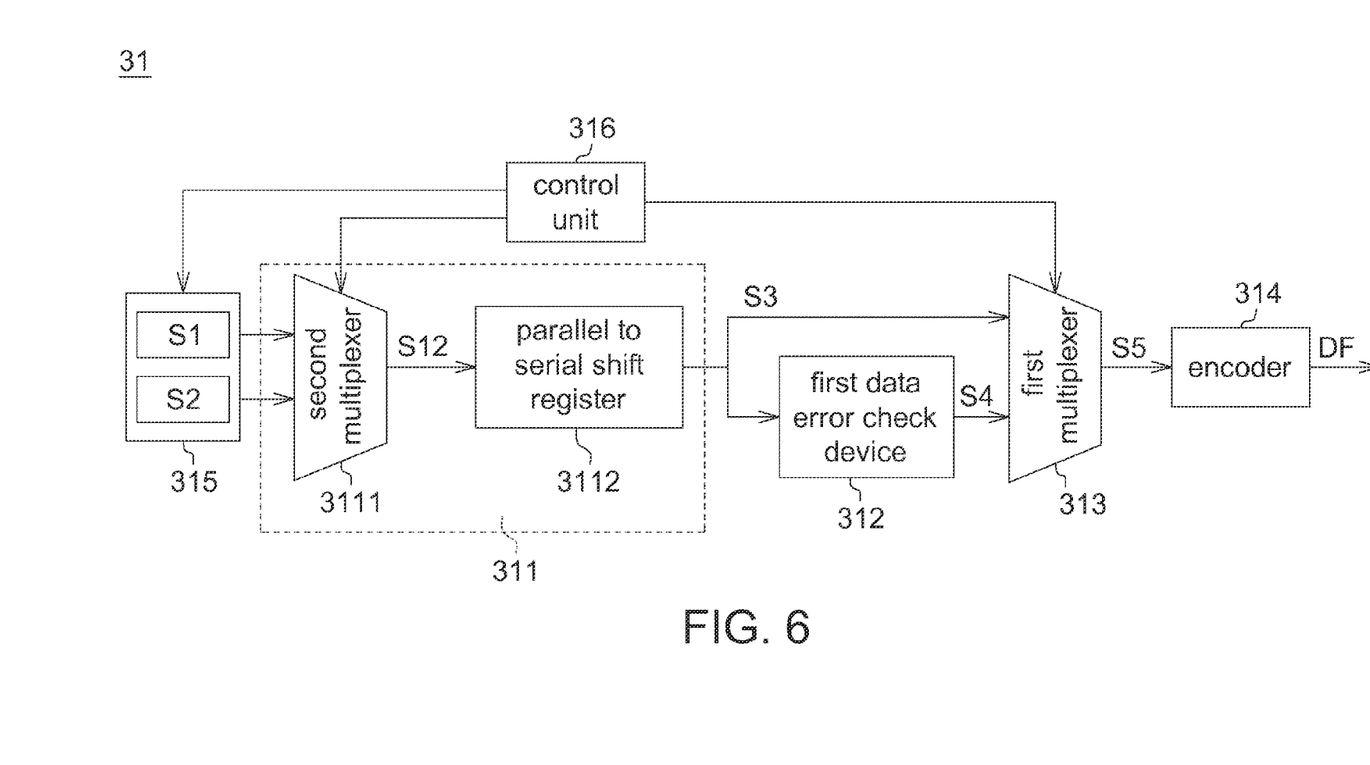
FIG. 6 shows a partial diagram of a master control module according to a first embodiment of the disclosure.
Figure 7:
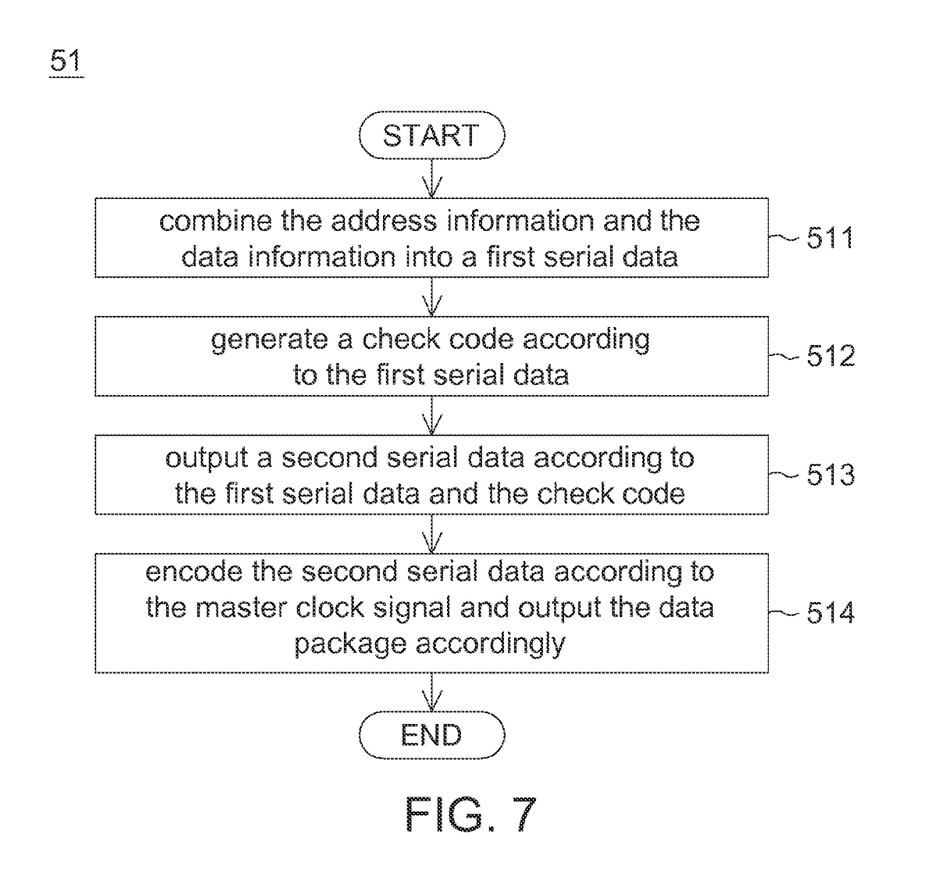
FIG. 7 shows a detailed flowchart of step 51.

Referring to FIG. 6 and FIG. 7. FIG. 6 shows a partial diagram of a master control module according to a first embodiment of the disclosure. FIG. 7 shows a detailed flowchart of step 51. The master control module 31 comprises a data combining circuit 311, a first data error check device 312, a first multiplexer 313, an encoder 314, a first register 315 and a control unit 316. The control unit 316 sets a time interval between the data package DF and another data package DF. The first register 315 stores an X-bit address information S1 and a Y-bit data information S2. The step 51 further comprises sub-steps 511~514. As indicated in step 511, the data combining circuit 311 combines the X-bit address information S1 and the Y-bit data information S2 into an (X+Y)-bit first serial data S3. As indicated in step 512, the first data error check device 312 generates a check code S4 according to the first serial data S3. The first data error check device 312 is realized by such as a cyclic redundancy check (CRC) device, and the check code S4 is such as a cyclic redundancy check code. As indicated in step 513, the first multiplexer 313 outputs an (X+Y+Z)-bit second serial data S5 according to the first serial data S3 and the check code S4. As indicated in step 514, the encoder 314 encodes the (X+Y+Z)-bit second serial data S5 according to a master clock signal CKM and outputs the data package DF. The encoder 314 such as performs Manchester encoding, return-to-zero (RZ) encoding, non-return-to-zero (NRZ-L) encoding, non-return-to-zero invert-on-ones encoding, differential Manchester encoding, bi-phase Manchester encoding or multi-level transmission 3 (MLT-3) encoding on the (X+Y+Z)-bit second serial data S5 according to the master clock signal CKM.

Figure 8:
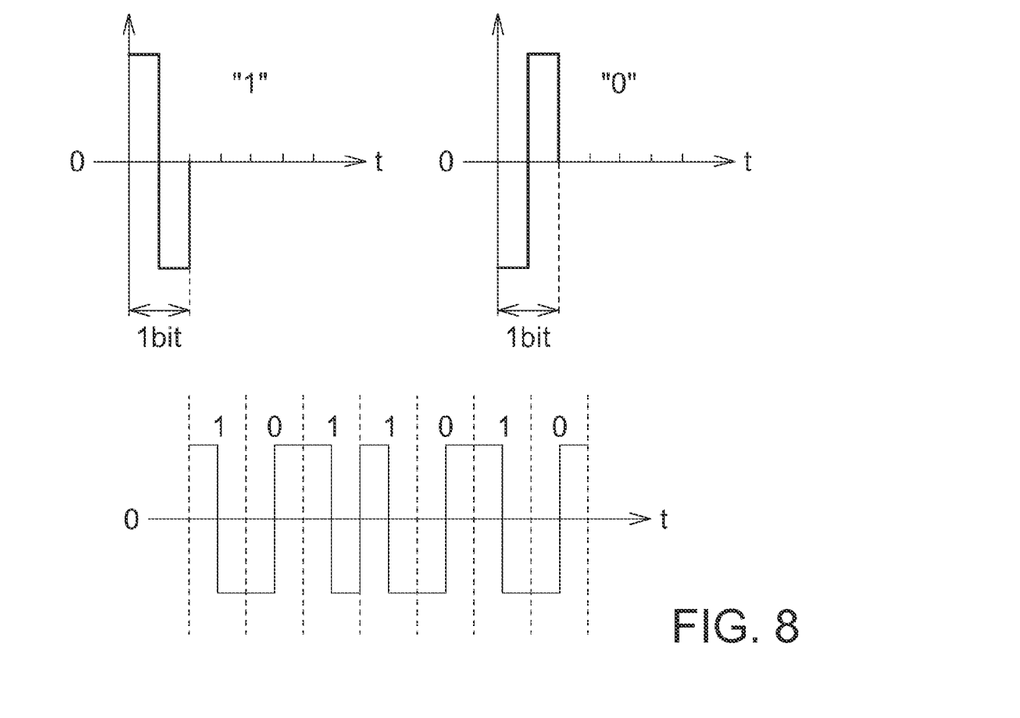
FIG. 8 and FIG. 9 show schematic diagrams of the technology of Manchester encoding.
Figure 9:
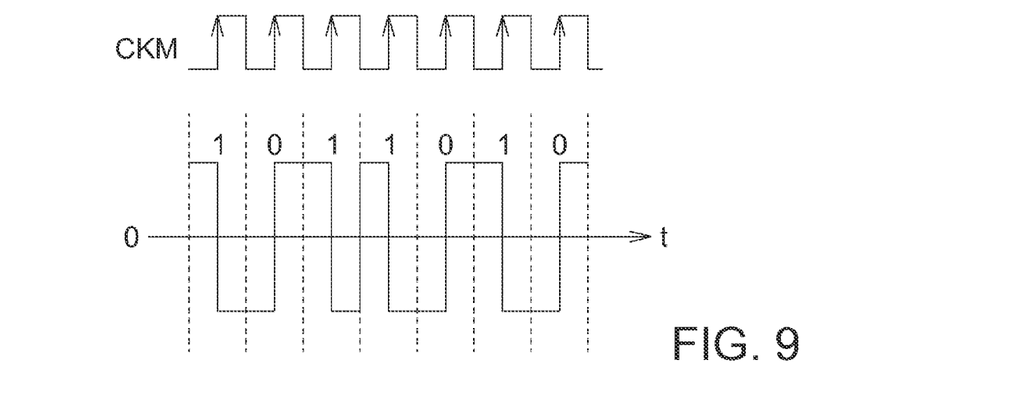

Referring to FIG. 8 and FIG. 9, schematic diagrams of the technology of Manchester encoding are shown. The encoder 314 can be realized by such as a Manchester decoder, a return-to-zero (RZ) encoder, a non-return-to-zero (NRZ-L) encoder, a non-return-to-zero invert-on-ones encoder, a differential Manchester encoder, a bi-phase Manchester encoder or a multi-level transmission3 (MLT-3) encoder.

For convenience purpose, the following elaboration is exemplified by a Manchester decoder. According to the technology of Manchester encoding, regardless of the data being "0" or "1", there is conversion of potential occurring in the middle of every bit time. When the potential is converted from a positive potential to a negative potential, the data is "1". When the potential is converted from a negative potential to a positive potential the data is "0".

Figure 10:
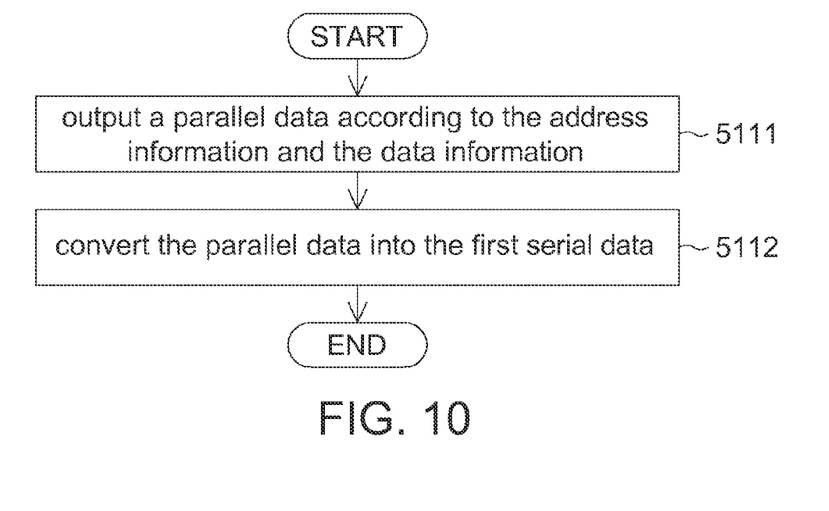
FIG. 10 shows a schematic diagram of step 511.

Referring to FIG. 6 and FIG. 10. FIG. 10 shows a schematic diagram of step 511. The data combining circuit 311 comprises a second multiplexer 3111 and a parallel to serial shift register 3112. The step 511 further comprises sub-steps 5111~5112. As indicated in step 5111, the second multiplexer 3111 outputs an (X+Y)-bit parallel data S12 according to the X-bit address information S1 and the Y-bit data information S2. As indicated in step 5112, the parallel to serial shift register 3112 converts the (X+Y)-bit parallel data S12 into an (X+Y)-bit first serial data S3.

As disclosed above, the control unit 316 can set a time interval between the data package DF and another data package DF. The user can input a time interval via a user interface, and the control unit 316 accordingly calculates the number of clock pulses corresponding to the time interval. The control unit 316 controls the first register 315, the second multiplexer 3111 and the first multiplexer 313 according to the number of clock pulses for setting the time interval between the data package and another data package to avoid the collision of data packages which occurs when the connection distance between the master control module and the current slave control modules is different from that between the master control module and other slave control modules.

Figure 11:
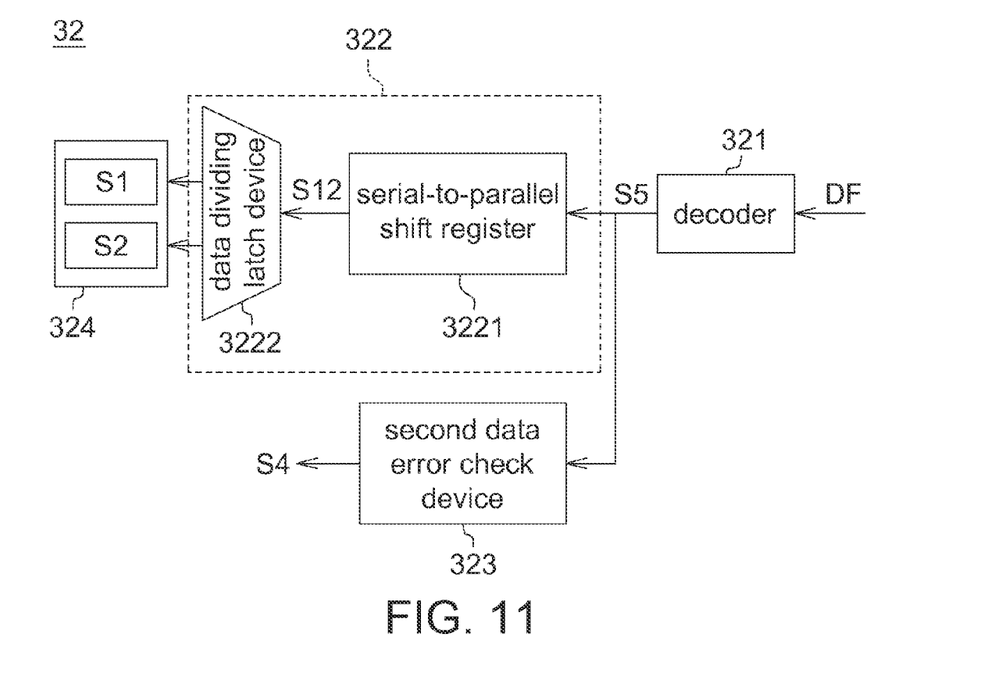
FIG. 11 shows a partial diagram of a slave control module according to a first embodiment of the disclosure.
Figure 12:
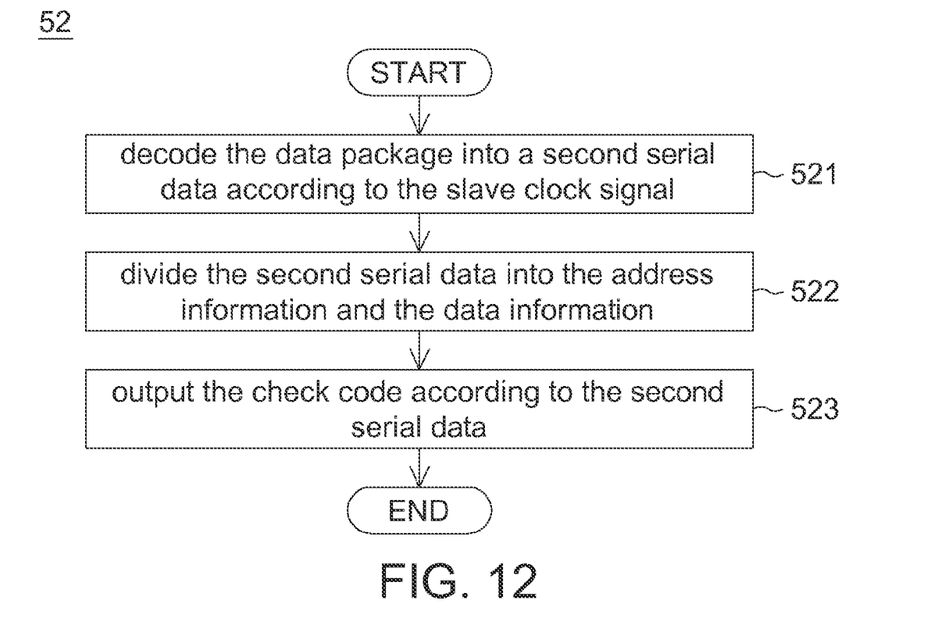
FIG. 12 shows a detailed flowchart of step 52.

Referring to FIG. 11 and FIG. 12. FIG. 11 shows a partial diagram of a slave control module according to a first embodiment of the disclosure. FIG. 12 shows a detailed flowchart of step 52. The slave control module 32 comprises a decoder 321, a data dividing circuit 322 and a second data error check device 323. The step 52 further comprises sub-steps 521~523. As indicated in step 521, the decoder 321 decodes the data package DF into an (X+Y+Z)-bit second serial data S5 according to a slave clock signal CKS. The decoder 321 can be realized by such as a Manchester decoder, a return-to-zero (RZ) decoder, a non-return-to-zero (NRZ-L) decoder, a non-return-to-zero invert-on-ones decoder, a differential Manchester decoder, a bi-phase Manchester decoder or a multi-level transmission 3 (MLT-3) decoder. The decoder 321 such as performs Manchester encoding, return-to-zero (RZ) decoding, a non-return-to-zero (NRZ-L) decoding, a non-return-to-zero invert-on-ones decoding, a differential Manchester decoding, a bi-phase Manchester decoding and multi-level transmission 3 (MLT-3) decoding on the data package DF according to the slave clock signal CKS.

As indicated in step 522, the data dividing circuit 322 divides the second serial data S5 into an X-bit address information S1 and a Y-bit data information S2. As indicated in step 523, the second data error check device 323 outputs a check code S4 according to the (X+Y+Z)-bit second serial data S5. The second data error check device 323 is such as a cyclic redundancy check (CRC) device, and the check code S4 is such as a cyclic redundancy check code. If the check code S4 is equal to a predetermined value, this indicates that data transmission is successful, then the X-bit address information S1 and the Y-bit data information are respectively stored to the second register 324. To the contrary, if the Z-bit check code S4 is not equal to predetermined value, this indicates that data transmission fails, then the slave control module 32 requests the master control module 31 to re-transmit the data package DF. Let the cyclic redundancy check code be taken for example. If the remainder is equal to 0, this indicates that data transmission is successful. To the contrary, if the remainder is not equal to 0, this indicates that data transmission fails, then the slave control module 32 requests the master control module 31 to re-send the data package DF.

Figure 13:
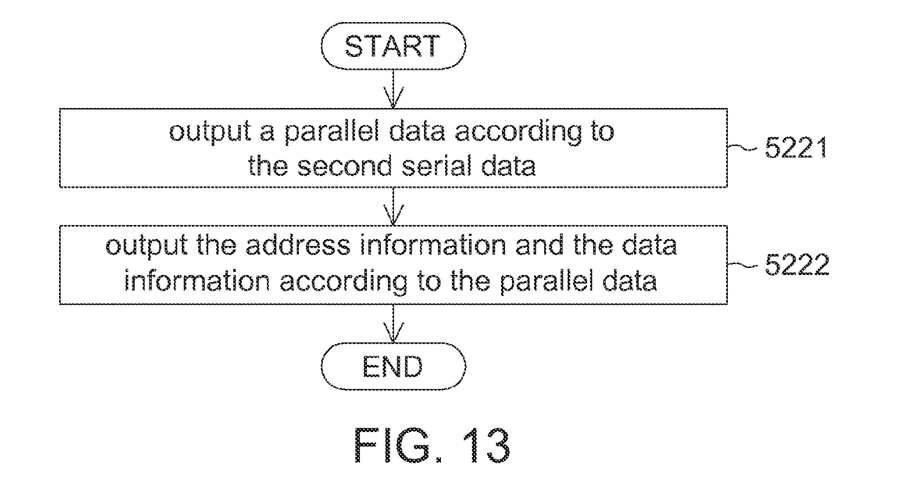
FIG. 13 shows a schematic diagram of step 522.

Referring to FIG. 11 and FIG. 13. FIG. 13 shows a schematic diagram of step 522. The data dividing circuit 322 further comprises a serial-to-parallel shift register 3221 and a data dividing latch device 3222. The step 522 further comprises sub-steps 5221~5222. As indicated in step 5221, the serial-to-parallel shift register 3221 outputs an (X+Y)-bit parallel data S12 according to a (X+Y+Z)-bit second serial data S5. As indicated in step 5222, the data dividing latch device 3222 outputs an X-bit address information S1 and a Y-bit data information S2 to the second register 324 according to the (X+Y)-bit parallel data S12.

Figure 14:
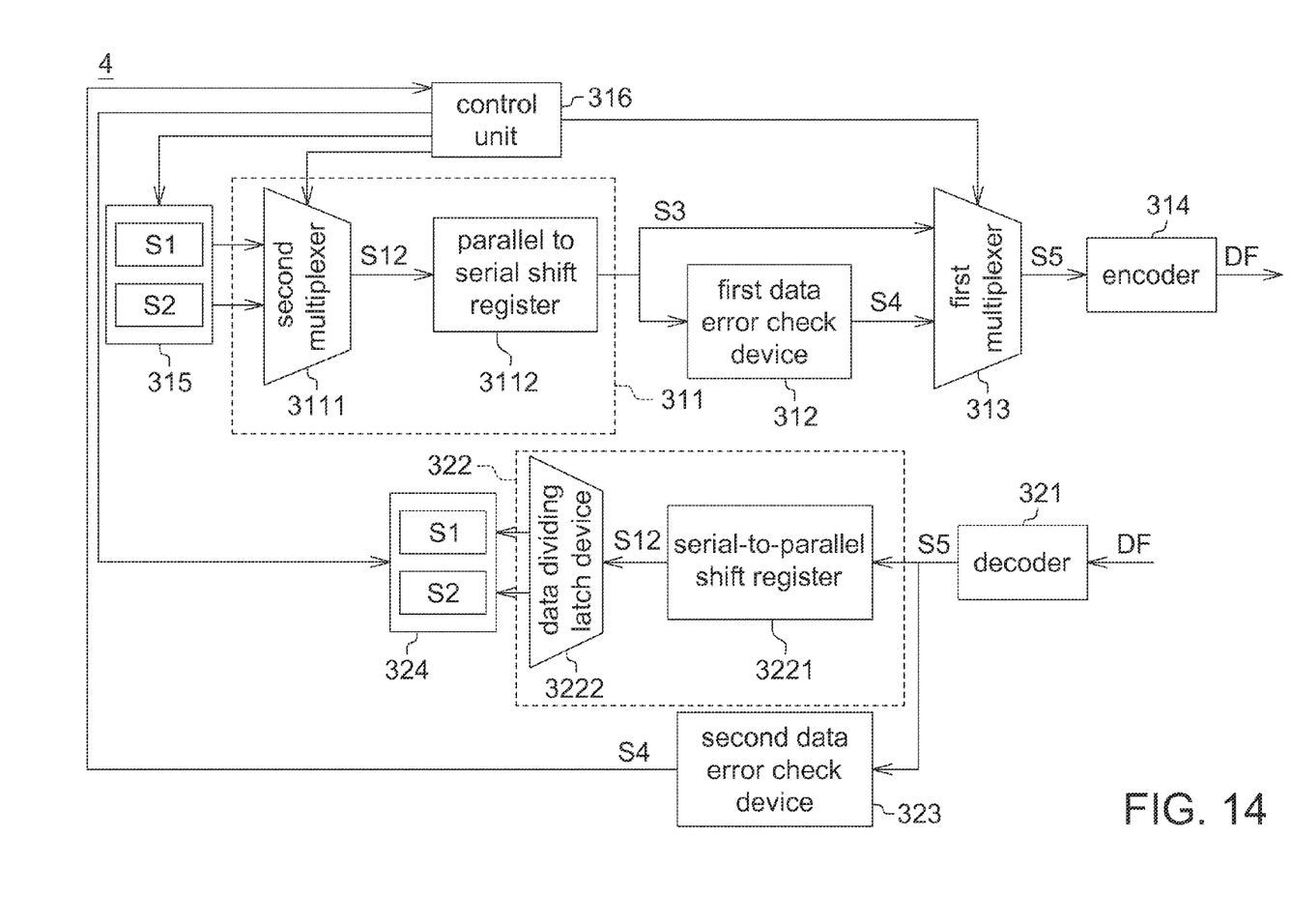
FIG. 14 shows a schematic diagram of a control module according to an embodiment of the disclosure.

Referring to FIG. 14, a schematic diagram of a control module according to an embodiment of the disclosure is shown. The control module 4 can be used as the master control module 31 or the slave control module 32. The control module 4 comprises a data combining circuit 311, a first data error check device 312, a first multiplexer 313, an encoder 314, a first register 315, a control unit 316, a decoder 321, a data dividing circuit 322, a second data error check device 323 and a second register 324. The data combining circuit 311 comprises a second multiplexer 3111 and a parallel to serial shift register 3112. The data dividing circuit 322 further comprises a serial-to-parallel shift register 3221 and a data dividing latch device 3222. The elements of the control module 4 are disclosed above, and the similarities are not repeated here. If the check code S4 is equal to a predetermined value, this indicates that data transmission is successful, then the control unit 316 controls the second register 324 to store a X-bit address information S1 and a Y-bit data information S2. To the contrary, if the Z-bit check code S4 is not equal to the predetermined value, this indicated that data transmission fails, then the control unit 316 controls the first register 315 to re-transmit the X-bit address information S1 and the Y-bit data information S2 to the second multiplexer 3111 so that the encoder 314 subsequently outputs the data package DF again.

While the disclosure has been described by way of example and in terms of the exemplary embodiment(s), it is to be understood that the disclosure is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. An asynchronous master-slave serial communication system, comprising:
    a master control module for generating a check code according to an address information and a data information, generating a data package according to the address information, the data information, the check code and a master clock signal, and transmitting the data package; and
    a slave control module for receiving the data package, generating a decoding data according to the data package and a slave clock signal, and generating the address information, the data information and the check code according to the decoding data, the slave control module comprising:
    a decoder for decoding the data package into a second serial data according to the slave clock signal;
    a data dividing circuit for dividing the second serial data into the address information and the data information, comprising:
        a serial-to-parallel shift register for outputting a parallel data according to the second serial data; and
        a data dividing latch device for outputting the address information and the data information according to the parallel data; and
    a second data error check device for outputting the check code according to the second serial data;
    wherein the master control module further comprises a control unit for setting a time interval between the data package and another data package.

2. The asynchronous master-slave serial communication system according to claim 1, wherein the master control module comprises:
    a data combining circuit for combining the address information and the data information into a first serial data;
    a first data error check device for generating the check code according to the first serial data;
    a first multiplexer for outputting a second serial data according to the first serial data and the check code; and
    an encoder for encoding the second serial data according to the master clock signal and outputting the data package.

3. The asynchronous master-slave serial communication system according to claim 2, wherein the data combining circuit comprises:
    a second multiplexer for outputting a parallel data according to the address information and the data information; and
    a parallel to serial shift register for converting the parallel data into the first serial data.

4. The asynchronous master-slave serial communication system according to claim 2, wherein the first data error check device is a cyclic redundancy check (CRC) device.

5. The asynchronous master-slave serial communication system according to claim 2, wherein the encoder is a Manchester decoder.

6. The asynchronous master-slave serial communication system according to claim 2, wherein the encoder is a return-to-zero (RZ) encoder, a non-return-to-zero (NRZ-L) encoder, a non-return-to-zero invert-on-ones encoder, a differential Manchester encoder, a bi-phase Manchester encoder or a multi-level transmission 3 (MLT-3) encoder.

7. The asynchronous master-slave serial communication system according to claim 1, wherein the second data error check device is a cyclic redundancy check (CRC) device.

8. The asynchronous master-slave serial communication system according to claim 1, wherein the decoder is a Manchester decoder.

9. The asynchronous master-slave serial communication system according to claim 1, wherein the decoder is a return-to-zero (RZ) decoder, a non-return-to-zero (NRZ-L) decoder, a non-return-to-zero invert-on-ones decoder, a differential Manchester decoder, a bi-phase Manchester decoder or a multi-level transmission 3 (MLT-3) decoder.

10. The asynchronous master-slave serial communication system according to claim 1, wherein when the check code is not equal to a predetermined value, and the slave control module requests the master control module to re-transmit the data package.

11. A data transmission method used in an asynchronous master-slave serial communication system, comprising:
   generating a check code according to an address information and a data information, generating a data package according to the address information, the data information, the check code and a master clock signal, and transmitting the data package;
   receiving the data package, generating a decoding data according to the data package and a slave clock signal, and generating the address information, the data information and the check code according to the decoding data;
   setting a time interval between the data package and another data package; and
   requesting the master control module to re-transmit the data package by the slave control module when the check code is not equal to a predetermined value;
   wherein the step of generating the address information, the data information and the check code comprises:
   decoding the data package into a second serial data according to the slave clock signal;
   dividing the second serial data into the address information and the data information; and
   outputting the check code according to the second serial data.

12. The data transmission method according to claim 11, wherein the step of generating a data package comprises:
   combining the address information and the data information into a first serial data;
   generating the check code according to the first serial data;
   outputting a second serial data according to the first serial data and the check code; and
   encoding the second serial data according to the master clock signal and outputting the data package accordingly.

13. The data transmission method according to claim 12, wherein the step of combining into a first serial data comprises:
   outputting a parallel data according to the address information and the data information; and
   converting the parallel data into the first serial data.

14. The data transmission method according to claim 12, wherein the check code is a cyclic redundancy check (CRC) device.

15. The data transmission method according to claim 12, wherein in the step of encoding the second serial data according to the master clock signal, Manchester encoding is performed on the second serial data according to the master clock signal.

16. The data transmission method according to claim 12, wherein in the step of encoding the second serial data according to the master clock signal, return-to-zero (RZ) encoding, non-return-to-zero (NRZ-L) encoding, non-return-to-zero invert-on-ones encoding, differential Manchester encoding, bi-phase Manchester encoding or multi-level transmission 3 (MLT-3) encoding is performed on the second serial data according to the master clock signal.

17. The data transmission method according to claim 11, wherein the step of dividing into the address information and the data information comprises:
   outputting a parallel data according to the second serial data; and
   outputting the address information and the data information according to the parallel data.

18. The data transmission method according to claim 11, wherein the check code is a cyclic redundancy check (CRC) device.

19. The data transmission method according to claim 11, wherein in the step of decoding the data package into a second serial data according to the slave clock signal, Manchester encoding is performed on the data package according to the slave clock signal.

20. The data transmission method according to claim 11, wherein in the step of decoding the data package into a second serial data according to the slave clock signal, return-to-zero (RZ) decoding, a non-return-to-zero (NRZ-L) decoding, a non-return-to-zero invert-on-ones decoding, a differential Manchester decoding, a bi-phase Manchester decoding and multi-level transmission 3(MLT-3) decoding is performed on the data package according to the slave clock signal.

21. A control module used in an asynchronous master-Slave serial communication system, comprising:
   a data combining circuit for combining an address information and a data information into a first serial data;
   a first data error check device for generating a check code according to the first serial data;
   a first multiplexer for outputting a second serial data according to the first serial data and the check code;
   an encoder for encoding the second serial data according to a master clock signal and outputting a data package;
   a control unit for setting a time interval between the data package and another data package;
   a decoder for decoding the data package into a second serial data according to the slave clock signal:
   a data dividing circuit for dividing the second serial data into the address information and the data information, comprising:
   a serial-to-parallel shift register for outputting a parallel data according to the second serial data; and
   a data dividing latch device for outputting the address information and the data information according to the parallel data; and
   a second data error check device for outputting the check code according to the second serial data.

22. The control module according to claim 21, wherein the data combining circuit comprises:
   a second multiplexer for outputting a parallel data according to the address information and the data information; and
   a parallel to serial shift register for converting the parallel data into the first serial data.

23. The control module according to claim 21, wherein the first data error check device is a cyclic redundancy check (CRC) device.

24. The control module according to claim 21, wherein the encoder is a Manchester decoder.

25. The control module according to claim 21, wherein the encoder is a return-to-zero (RZ) encoder, a non-return-to-zero (NRZ-L) encoder, a non-return-to-zero invert-on-ones encoder, a differential Manchester encoder, a bi-phase Manchester encoder or a multi-level transmission 3 (MLT-3) encoder.

26. The control module according to claim 21, wherein the second data error check device is a cyclic redundancy check (CRC) device.

27. The control module according to claim 21, wherein the decoder is a Manchester decoder.

28. The control module according to claim 21, wherein the decoder is a return-to-zero (RZ) decoder, a non-return-to-zero (NRZ-L) decoder, a non-return-to-zero invert-on-ones decoder, a differential Manchester decoder, a bi-phase Manchester decoder or a multi-level transmission 3 (MLT-3) decoder.

29. The control module according to claim 21, wherein when the check code is not equal to a predetermined value, the control module requests to re-transmit the data package.

* * * * *